(12) United States Patent
Ning

(10) Patent No.: US 6,972,251 B2
(45) Date of Patent: Dec. 6, 2005

(54) METHOD FOR FABRICATING COPPER DAMASCENE STRUCTURES IN POROUS DIELECTRIC MATERIALS

(75) Inventor: Xian Jie Ning, Shanghai (CN)

(73) Assignee: Semiconductor Manufactoring International (Shanghai) Corporation, Shanghai (CN)

( * ) Notice: Subject to any disclaimer, the term of this patent is extended or adjusted under 35 U.S.C. 154(b) by 62 days.

(21) Appl. No.: 10/391,538

(22) Filed: Mar. 17, 2003

(65) Prior Publication Data

US 2004/0126997 A1 Jul. 1, 2004

(30) Foreign Application Priority Data

Dec. 27, 2002 (CN) .................................. 02160506

(51) Int. Cl.$^7$ ......................................... H01L 21/4763
(52) U.S. Cl. ...................... 438/622; 438/618; 438/624; 438/637; 257/3; 257/4; 257/758
(58) Field of Search ................................ 438/618, 622, 438/624, 637; 257/3, 4, 758

(56) References Cited

U.S. PATENT DOCUMENTS

| 6,350,679 B1 * | 2/2002 | McDaniel et al. .......... 438/634 |
| 6,355,555 B1 * | 3/2002 | Park ........................... 438/634 |
| 6,403,461 B1 * | 6/2002 | Tae et al. .................... 438/619 |
| 6,524,962 B2 * | 2/2003 | Chen et al. ................. 438/694 |
| 6,756,297 B2 * | 6/2004 | Park ........................... 438/624 |
| 6,780,753 B2 * | 8/2004 | Latchford et al. .......... 438/619 |

* cited by examiner

*Primary Examiner*—Alexander Ghyka
(74) *Attorney, Agent, or Firm*—Townsend, Townsend and Crew LLP

(57) ABSTRACT

A method for manufacturing integrated circuit devices including metal interconnect structures. The method includes forming a first dielectric material overlying a surface of a semiconductor substrate. The method also includes forming a metal damascene structure in the first dielectric material, which surrounds the metal damascene structure. The method selectively removes the first dielectric material surrounding a portion of the metal damascene structure to expose the portion of the metal damascene structure. The method forms a porous dielectric material surrounding a vicinity of the exposed portion of the metal damascene structure, whereupon the porous dielectric material has a dielectric constant ranging from no greater than 2.6 but greater than 1.

13 Claims, 8 Drawing Sheets

METHOD FOR FABRICATING COPPER DAMASCENE STRUCTURES IN POROUS DIELECTRIC MATERIALS

CROSS-REFERENCES TO RELATED APPLICATIONS

This application claims priority from a Republic of China application entitled METHOD FOR FABRICATING COPPER DAMASCENE STRUCTURES IN POROUS DIELECTRIC MATERIALS filed Dec. 27, 2002 and assigned R.O.C. Application No. 02160505.X, the disclosure of which is hereby incorporated in its entirety for all purposes.

STATEMENT AS TO RIGHTS TO INVENTIONS MADE UNDER FEDERALLY SPONSORED RESEARCH OR DEVELOPMENT

Not applicable

REFERENCE TO A "SEQUENCE LISTING," A TABLE, OR A COMPUTER PROGRAM LISTING APPENDIX SUBMITTED ON A COMPACT DISK

Not applicable

BACKGROUND OF THE INVENTION

The present invention is directed to integrated circuits and their processing for the manufacture of semiconductor devices. More particularly, the invention provides a method and device for manufacturing a metal inter-connect structure having a porous interlayer dielectric fill material, which has a low dielectric constant. Merely by way of example, the invention has been applied to a copper metal damascene structure such as a dual damascene structure for advanced signal processing devices. But it would be recognized that the invention has a much broader range of applicability. For example, the invention can be applied to microprocessor devices, memory devices, application specific integrated circuit devices, as well as various other interconnect structures.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Increasing circuit density has not only improved the complexity and performance of ICs but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility. Making devices smaller is very challenging, as each process used in IC fabrication has a limit. That is to say, a given process typically only works down to a certain feature size, and then either the process or the device layout needs to be changed. An example of such a limit is the ability to form interchanging metal and dielectric layers, where the metal layers to not interact with each other in the form of noise.

As merely an example, aluminum metal layers have been the choice of material for semiconductor devices as long as such layers have been used in the first integrated circuit device. Such first integrated circuit device has been developed by Robert Noyce at Fairchild Semiconductor. Aluminum had been the choice since it provides good conductivity and sticks to dielectric materials as well as semiconductor materials. Most recently, aluminum metal layers have been replaced, in part, by copper interconnects. Copper interconnects have been used with low k dielectric materials to form advanced conventional semiconductor devices. Copper has improved resistance values of aluminum for propagating signals through the copper interconnect at high speeds. As devices become smaller and demands for integration become greater, limitations in copper and low k dielectric materials include unwanted interaction between copper lines for very high-speed integrated circuit devices. Additionally, the low k dielectric materials become embedded with metal impurities, which lead to conductive characteristics in the dielectric materials. Such conductive characteristics lead to operation and/or reliability issues with the high-speed integrated circuit devices.

From the above, it is seen that an improved technique for processing semiconductor devices is desired.

BRIEF SUMMARY OF THE INVENTION

According to the present invention, techniques including methods for the manufacture of semiconductor devices are provided. More particularly, the invention provides a method and device for manufacturing a metal inter-connect structure having a porous interlayer dielectric fill material, which has a low dielectric constant. Merely by way of example, the invention has been applied to a copper metal damascene structure such as a dual damascene structure for advanced signal processing devices. But it would be recognized that the invention has a much broader range of applicability. For example, the invention can be applied to microprocessor devices, memory devices, application specific integrated circuit devices, as well as various other interconnect structures.

In a specific embodiment, the invention provides a method for manufacturing integrated circuit devices including metal interconnect structures. The method includes forming a first dielectric material overlying a surface of a semiconductor substrate. The method also includes forming a metal damascene structure in the first dielectric material, which surrounds the metal damascene structure. The method selectively removes the first dielectric material surrounding a portion of the metal damascene structure to expose the portion of the metal damascene structure. The method forms a porous dielectric material surrounding a vicinity of the exposed portion of the metal damascene structure, whereupon the porous dielectric material has a dielectric constant ranging from no greater than 2.6 but greater than 1.

In an alternative specific embodiment, the invention provides a semiconductor integrated circuit device structure. The device structure has a first dielectric material overlying a surface of a semiconductor substrate. A metal damascene structure has a lower portion that is surrounded by the first dielectric material. A porous dielectric material surrounds a vicinity of an upper portion of the metal damascene structure, whereupon the porous dielectric material has a dielectric constant ranging from no greater than 2.6 but greater than 1. A metal capping layer is overlying a top portion of the metal damascene structure. A liner layer surrounds the metal damascene structure, including sides and a bottom portion. The metal capping layer and the liner layer enclose the metal damascene structure to maintain the porous dielectric material substantially free from contamination with metal impurities from the metal damascene structure.

In an alternative specific embodiment, the invention provides yet another method for manufacturing integrated circuit devices including metal interconnect structures. The method includes forming a first dielectric layer overlying a surface of a semiconductor substrate and forming a conductive interconnect layer overlying the first dielectric layer. The method also includes forming a first inter-layer dielectric overlying the conductive interconnect layer. The method forms a metal damascene structure in the first interdielectric material, which surrounds the metal damascene structure to enclose a portion of the metal damascene structure. The method planarizes the metal damascene structure to a vicinity of an upper surface of the first interlayer dielectric layer. A capping layer is formed overlying the planarized metal damascene structure to protect the metal damascene structure. The method selectively removes a portion of the first dielectric material surrounding a portion of the metal damascene structure to expose the portion of the metal damascene structure. The method forms a porous dielectric material surrounding a vicinity of the exposed portion of the metal damascene structure, whereupon the porous dielectric material has a dielectric constant value ranging from no greater than 2.6 but greater than 1 based upon at least a presence of a plurality of microbubbles within the porous dielectric material. The method forms a capping dielectric layer overlying an exposed surface of the porous dielectric material to prevent a possibility of moisture from entering into one or more microbubbles structures within the porous dielectric material.

Many benefits are achieved by way of the present invention over conventional techniques. For example, the present technique provides an easy to use process that relies upon conventional technology. In some embodiments, the method provides higher device yields in dies per wafer. Additionally, the method provides a process that is compatible with conventional process technology without substantial modifications to conventional equipment and processes. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

According to the present invention, techniques including methods for the manufacture of semiconductor devices are provided. More particularly, the invention provides a method and device for manufacturing a metal inter-connect structure having a porous interlayer dielectric fill material, which has a low dielectric constant. Merely by way of example, the invention has been applied to a copper metal damascene structure such as a dual damascene structure for advanced signal processing devices. But it would be recognized that the invention has a much broader range of applicability. For example, the invention can be applied to microprocessor devices, memory devices, application specific integrated circuit devices, as well as various other interconnect structures.

Figure 1:
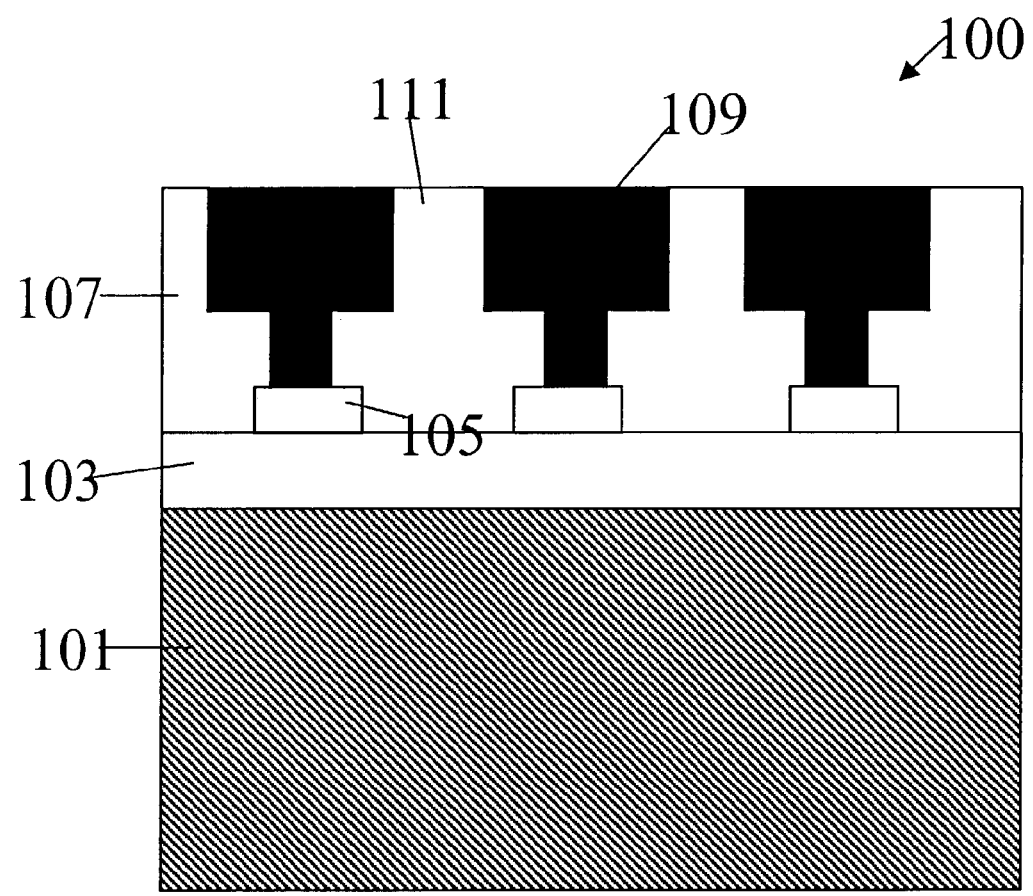
FIG. 1 is a simplified side-view diagram of a partially completed inter-connect structure for a semiconductor integrated circuit device according to an embodiment of the present invention.
Figure 2:
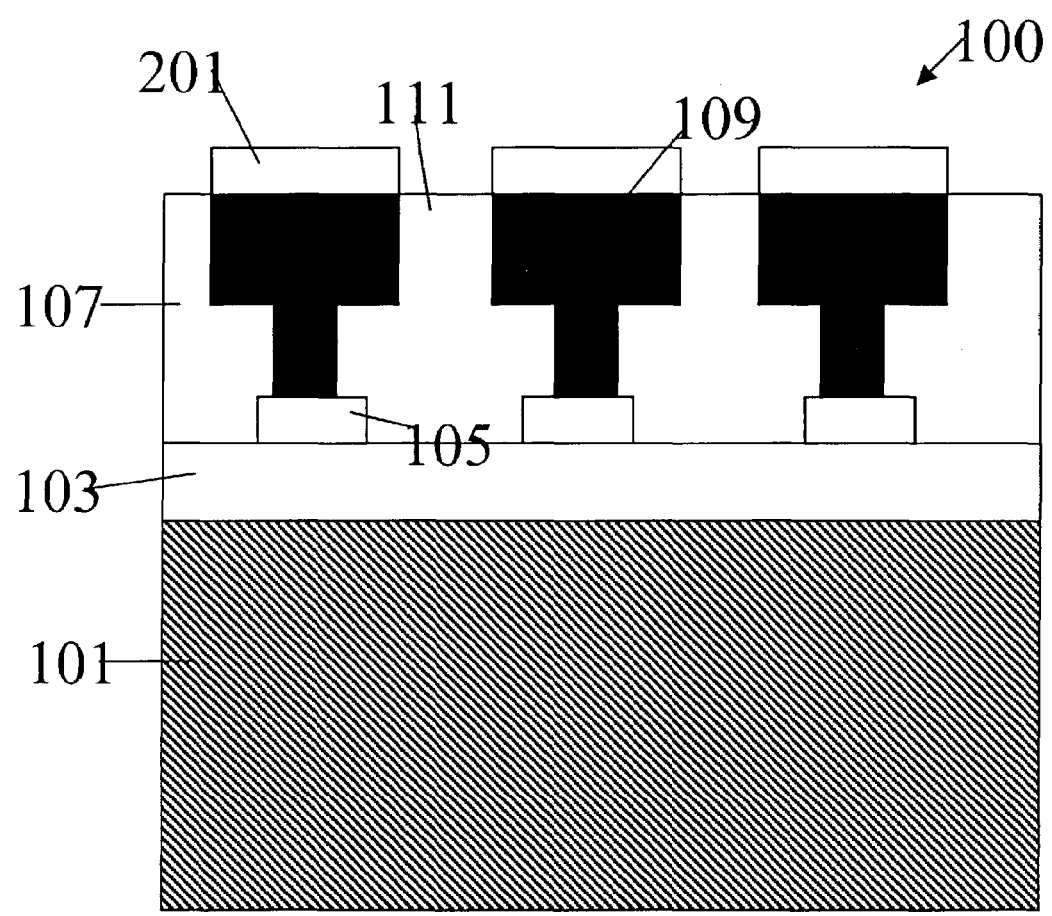
FIGS. 2 through 8 illustrate methods of fabricating an interconnect structure according to embodiments of the present invention.

FIG. 1 is a simplified side-view diagram of a partially completed interconnect structure 100 for a semiconductor integrated circuit device according to an embodiment of the present invention. One of ordinary skill in the art would recognize many other variations, modifications, and alternatives. As shown, the interconnect structure includes substrate 101, which is a semiconductor substrate such as a silicon wafer or the like. An overlying dielectric layer 103 is provided. A plurality of interconnects 105 are often formed overlying the dielectric layer. Interconnects can be formed from a variety of materials such as doped polysilicon, single crystal silicon, metal (e.g., aluminum), refractory metals (e.g., tungsten), any combination of these, or the like.

The structure has an interlayer dielectric material 107, which forms a thickness to support metal damascene structure 109. The metal damascene structure includes single damascene structures, dual damascene structures, and others. As an example, such structure can be made from a variety of materials such as copper, aluminum, a combination of these and other materials, which serve as liners, barrier materials, etc. Alternatively, the metal damascene structure can be made of a heavily doped polysilicon material or the like. The upper surface, which includes portions of the metal structure and interlayer dielectric material, has been planarized. A chemical mechanical polishing or planarization process often flattens the upper surface. The process often uses selective etchants and other materials, which do not substantially remove portions of the metal structure according to this present embodiment. Details of further processing can be found throughout the present specification and more particularly below.

A method according to an embodiment of the present invention can be briefly provided as follows:

1. Form dielectric layer overlying surface of a semiconductor substrate;

2. Form conductive layer overlying the dielectric layer;

3. Pattern conductive layer to form an interconnect structure overlying the dielectric layer;

4. Form interlayer dielectric layer overlying the conductive layer;

5. Pattern the interlayer dielectric layer;

6. Form liner layer within the patterned interlayer dielectric layer;

7. Form metal layer within the liner layer of the patterned interlayer dielectric layer to a height above a surface of the interlayer dielectric layer;

8. Planarize excess metal layer;

9. Form capping layer overlying the metal layer;

10. Selectively remove the interlayer dielectric layer to expose a portion of the metal layer;

11. Form low K or porous dielectric fill layer surrounding the exposed portion of the metal layer;

12. Form capping layer overlying the low K or porous dielectric fill layer; and

13. Perform other steps as desired.

The above sequence of steps provides a method according to an embodiment of the present invention. As shown, the method uses a combination of steps including a way of selectively removing the interlayer dielectric material to leave a portion of the metal layer exposed. The exposed portion is surrounded using a porous layer, which has a very low dielectric constant. Other alternatives can also be provided where steps are added, one or more steps are removed, or one or more steps are provided in a different sequence without departing from the scope of the claims herein. Further details of the present method can be found throughout the present specification and more particularly below.

Before proceeding with the above method, an alternative method according to the present invention may be outlined as follows:

1. Form dielectric layer overlying surface of a semiconductor substrate;
2. Form conductive layer overlying the dielectric layer;
3. Pattern conductive layer to form an interconnect structure overlying the dielectric layer;
4. Form interlayer dielectric layer overlying the conductive layer;
5. Pattern the interlayer dielectric layer;
6. Form liner layer within the patterned interlayer dielectric layer;
7. Form metal layer within the liner layer of the patterned interlayer dielectric layer to a height above a surface of the interlayer dielectric layer;
8. Planarize excess metal layer;
9. Recess upper portion of metal layer to a vicinity below the surface of the interlayer dielectric layer;
10. Form capping layer overlying the metal layer to a vicinity above the surface of the interlayer dielectric layer;
11. Planarize capping layer to expose the surface of the interlayer dielectric layer;
12. Selectively remove the interlayer dielectric layer to expose a portion of the metal layer;
13. Form low K or porous dielectric fill layer surrounding the exposed portion of the metal layer;
14. Form capping layer overlying the low K or porous dielectric fill layer; and
15. Perform other steps as desired.

The above sequence of steps provides a method according to an embodiment of the present invention. As shown, the method uses a combination of steps including a way of selectively removing the interlayer dielectric material to leave a portion of the metal layer exposed. The exposed portion is surrounded using a porous layer, which has a very low dielectric constant. Other alternatives can also be provided where steps are added, one or more steps are removed, or one or more steps are provided in a different sequence without departing from the scope of the claims herein. Preferably, the method uses a capping layer, which is provided in a recessed portion of the metal layer to protect such metal layer to selective removal of the interlayer dielectric material. Further details of the present method can be found throughout the present specification and more particularly below.

Yet an alternative method according to the present invention may be outlined as follows:

1. Form dielectric layer including oxide overlying surface of a semiconductor substrate;
2. Form conductive polysilicon or metal layer overlying the dielectric layer;
3. Pattern conductive layer to form an interconnect structure overlying the dielectric layer;
4. Form one or more interlayer dielectric layer(s) overlying the conductive layer;
5. Pattern the interlayer dielectric layer;
6. Form liner layer within the patterned interlayer dielectric layer;
7. Form metal layer (e.g., copper, tungsten, aluminum) within the liner layer of the patterned interlayer dielectric layer to a height above a surface of the interlayer dielectric layer;
8. Planarize excess metal layer;
9. Recess upper portion of metal layer to a vicinity below the surface of the interlayer dielectric layer;
10. Form capping layer overlying the metal layer to a vicinity above the surface of the interlayer dielectric layer;
11. Planarize capping layer to expose the surface of the interlayer dielectric layer;
12. Selectively remove the interlayer dielectric layer to expose a portion of the metal layer;
13. Form barrier dielectric layer overlying the exposed portions of the metal layer;
14. Form low K or porous dielectric fill layer surrounding the exposed portion of the metal layer;
15. Form capping layer overlying the low K or porous dielectric fill layer; and
16. Perform other steps as desired.

The above sequence of steps provides a method according to an alternative embodiment of the present invention. As shown, the method uses a combination of steps including a way of selectively removing the interlayer dielectric material to leave a portion of the metal layer exposed. Preferably, the method also uses a capping layer, which is provided in a recessed portion of the metal layer to protect such metal layer to selective removal of the interlayer dielectric material. The exposed portion is surrounded using a porous layer, which has a very low dielectric constant. Other alternatives can also be provided where steps are added, one or more steps are removed, or one or more steps are provided in a different sequence without departing from the scope of the claims herein. Preferably, the method uses a capping layer overlying exposed portions of the metal layer before application of the porous layer. Further details of the present method can be found throughout the present specification and more particularly below.

FIGS. 2 through 8 illustrate methods of fabricating an interconnect structure for a semiconductor integrated circuit device according to embodiments of the present invention. These diagrams are merely examples, which should not unduly limit the scope of the claims herein. One of ordinary skill in the art would recognize many other variations, modifications, and alternatives. As shown, the method forms a capping layer 201 overlying the damascene structure 109. Also shown are interconnect structure 105, which are provided within interlayer dielectric material 107. The capping layer can be made of a variety of materials such as cobalt tungsten phosphide ("CoWP"), or cobalt phosphide ("CoP"), or other compatible materials. Such capping layer can be provided using a variety of suitable techniques. Examples of such techniques include, but are not limited to, plating, plasma deposition, low-pressure deposition, any combination of these, and others. The capping layer provides protection of the damascene structure for later processes, which are used to remove the interlayer dielectric material.

Figure 3:
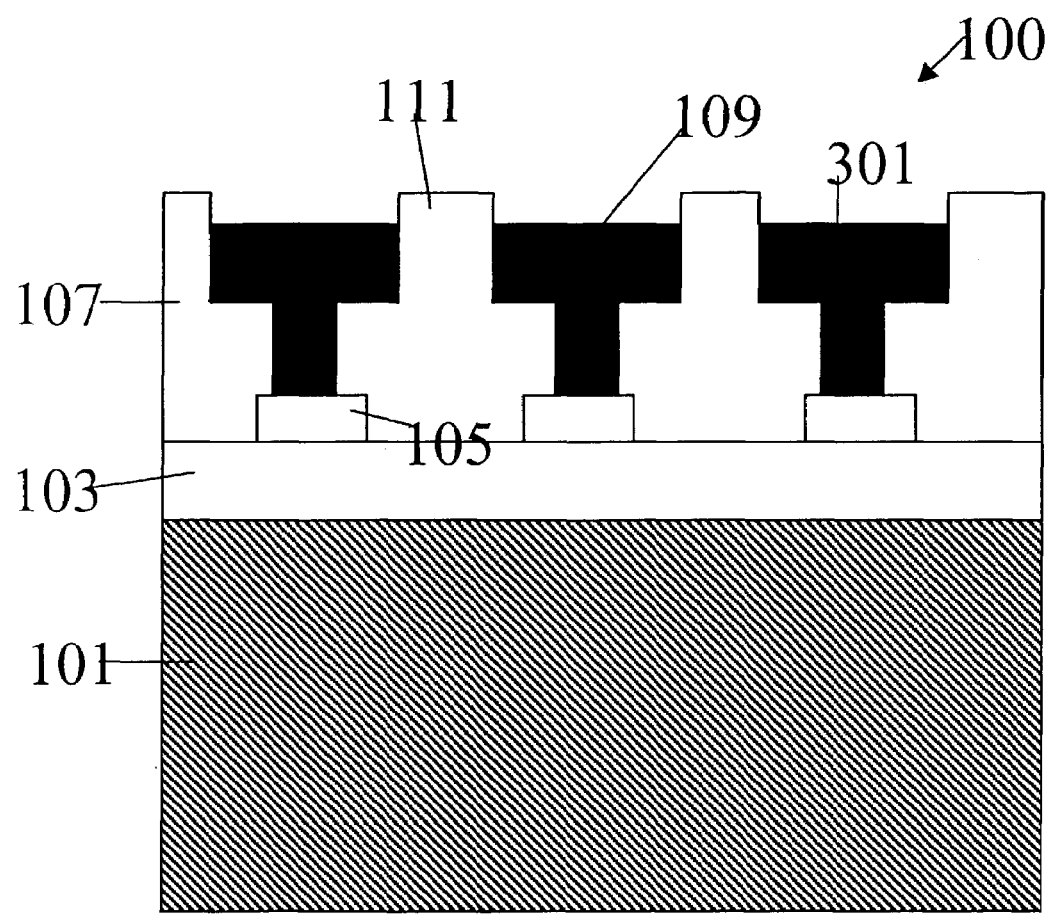
Figure 4:
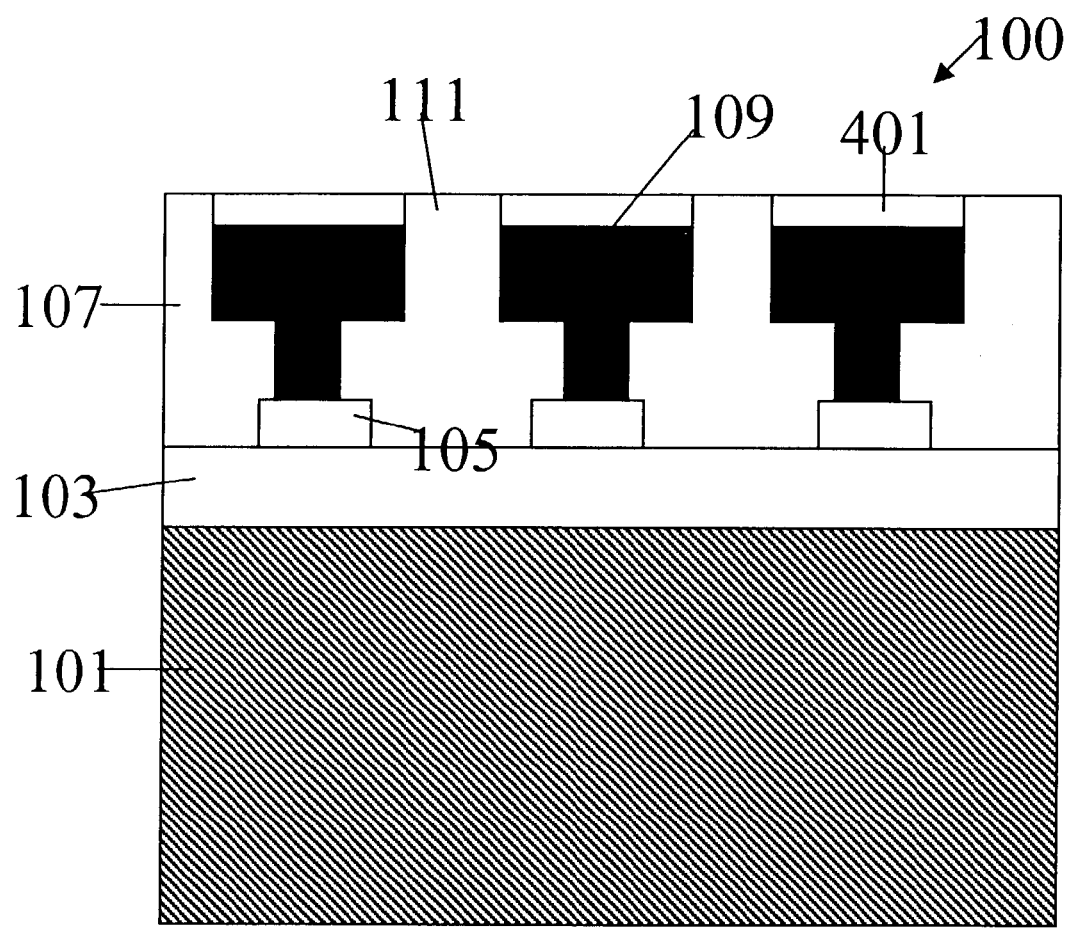

In an alternative specific embodiment, the method removes a portion of the damascene structure to recess an upper portion 301 of metal layer to vicinity below the surface of the interlayer dielectric layer, as illustrated by FIG. 3. The recessed region 301 exposes a top portion of the damascene structure. The method forms a capping layer overlying the damascene structure where the capping layer has been formed even in height to the surface of the interlayer dielectric layer. A capping layer 401 fits within the recessed region as illustrated in FIG. 4. Exposed regions of the interlayer dielectric layer are also shown.

Figure 5:
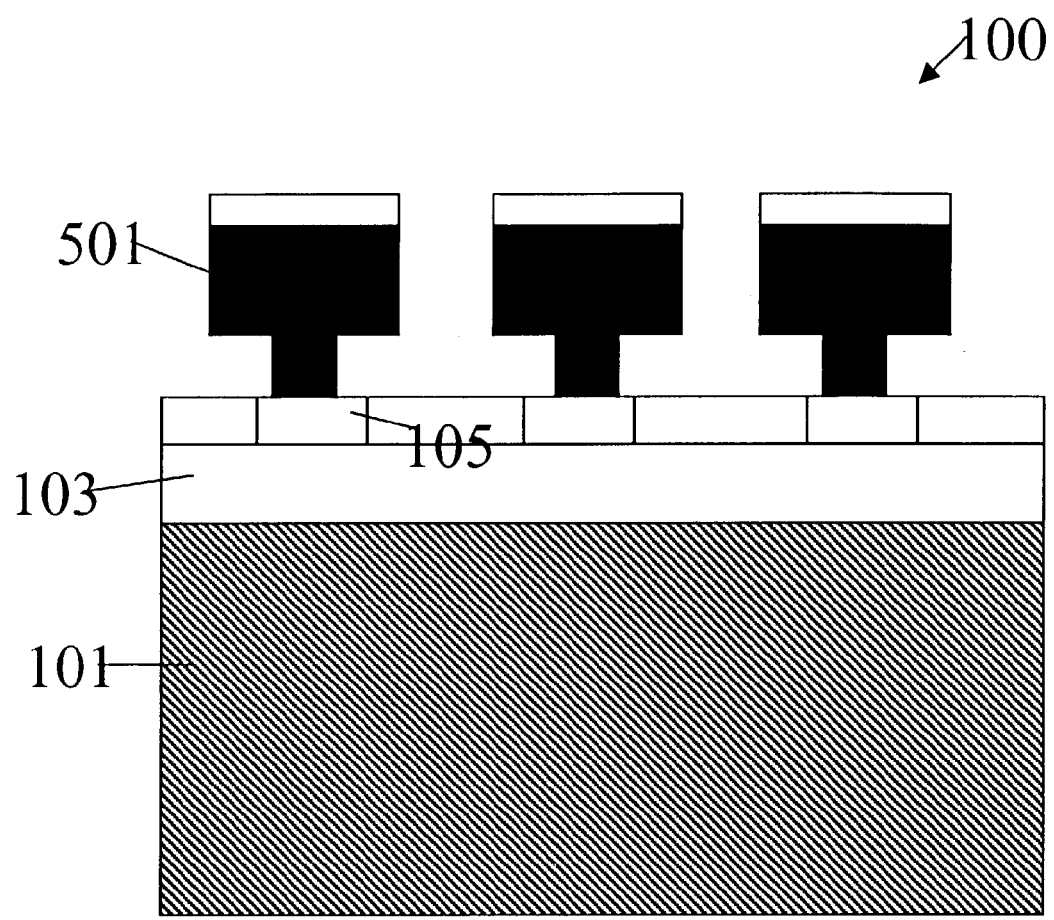
Figure 6:
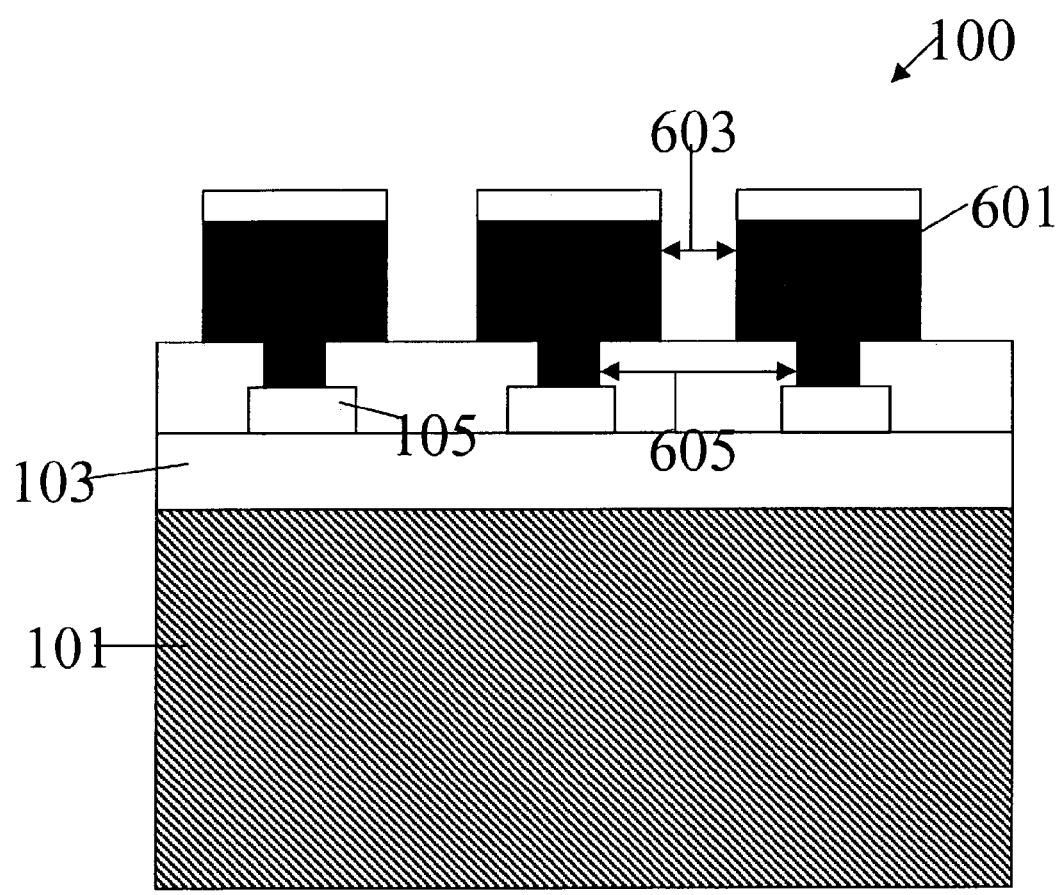

The method selectively removes the interlayer dielectric layer, as illustrated by FIG. 5. The damascene structure includes exposed portions 501, which are free from contact with any dielectric layers or other material. The exposed portions are subjected to fluid region, e.g., air, gas, inert gas. Selective removal is achieved using a selective etchant, including wet etchants and dry etchants, such as plasma etching. Alternatively, dry or plasma etching may be used. A combination of wet and dry etching techniques can also be used depending upon the application. Alternatively, only an upper portion 601 of the damascene structure is exposed, as illustrated by FIG. 6. The exposed portion of the damascene structure is spaced apart from another damascene structure by a predetermined width 603. The width 603 is narrower than a predetermined width 605 of a lower portion of the damascene structure. For a copper interconnect damascene structure predetermined width 603 is greater by about selected amount than predetermined width 605, where conventional (e.g., non-porous) interlayer dielectric materials can be used within predetermined width 605. Preferably, the selective removal process of the interlayer dielectric layer uses selective chemistries. As merely an example, selective chemistries include selective plasma etching processes. Alternatively, wet-etching processes can also be used. Of course, the particular removal process will depend highly upon the specific application as well as other parameters.

Figure 7:
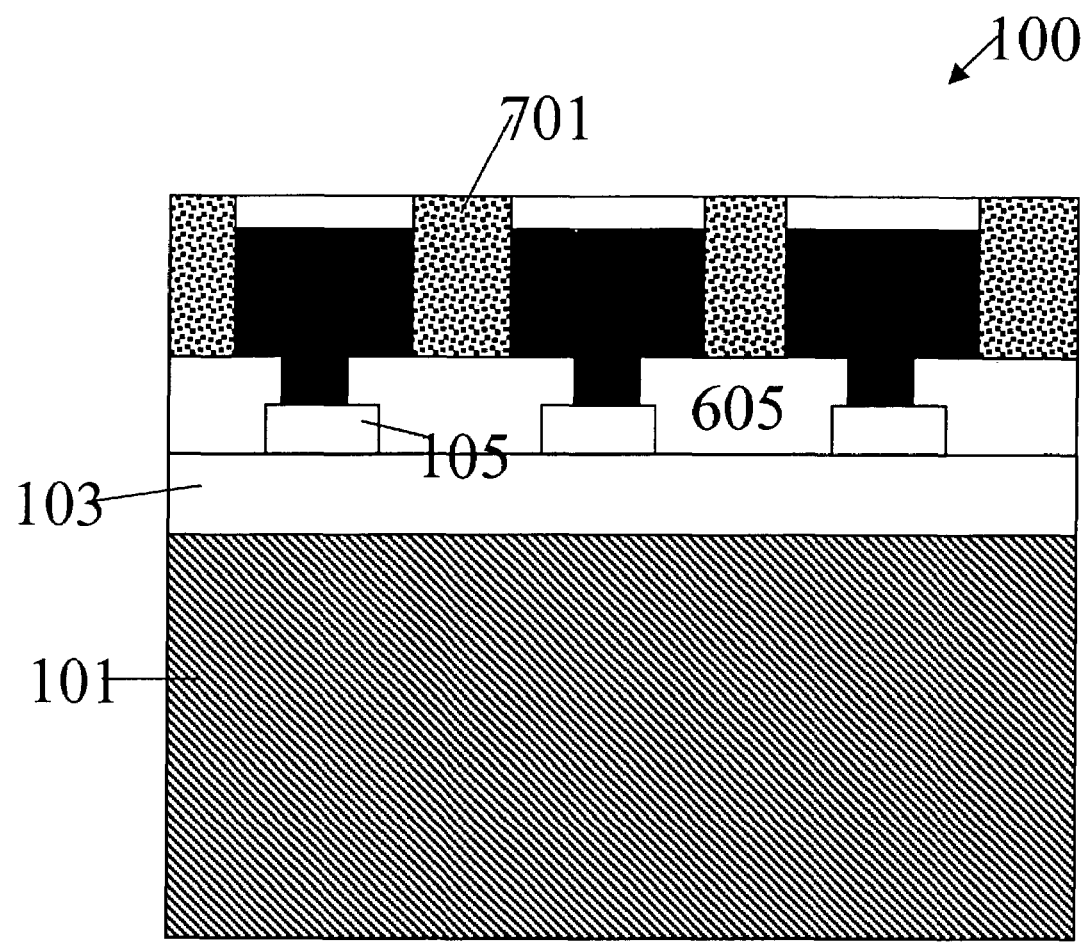

The method forms low K or porous dielectric fill layer surrounding the exposed portion of the metal layer, as illustrated by FIG. 7. The porous fill layer is preferably made using low k dielectric materials such as those products sold under SILK™ by Dow Chemical Company, Black Diamond™ by Applied Materials, Inc., and others, which have air bubbles formed therein. Such air bubbles are often microbubbles having a dimension of about a nanometer to tens or perhaps hundreds of nanometers. The presence of the microbubbles, which are then embedded in the fixed low k dielectric material reduces the dielectric constant of such material to below 2.7 but above 1, which corresponds to air. The dielectric material having the microbubbles forms a porous material, which has improved dielectric characteristics. In a specific embodiment, a nitride-capping layer is provided overlying surfaces of the exposed damascene structure to prevent metal impurities from diffusing into the low k dielectric material. Other types of capping layers can also be used, depending upon the application.

Figure 8:
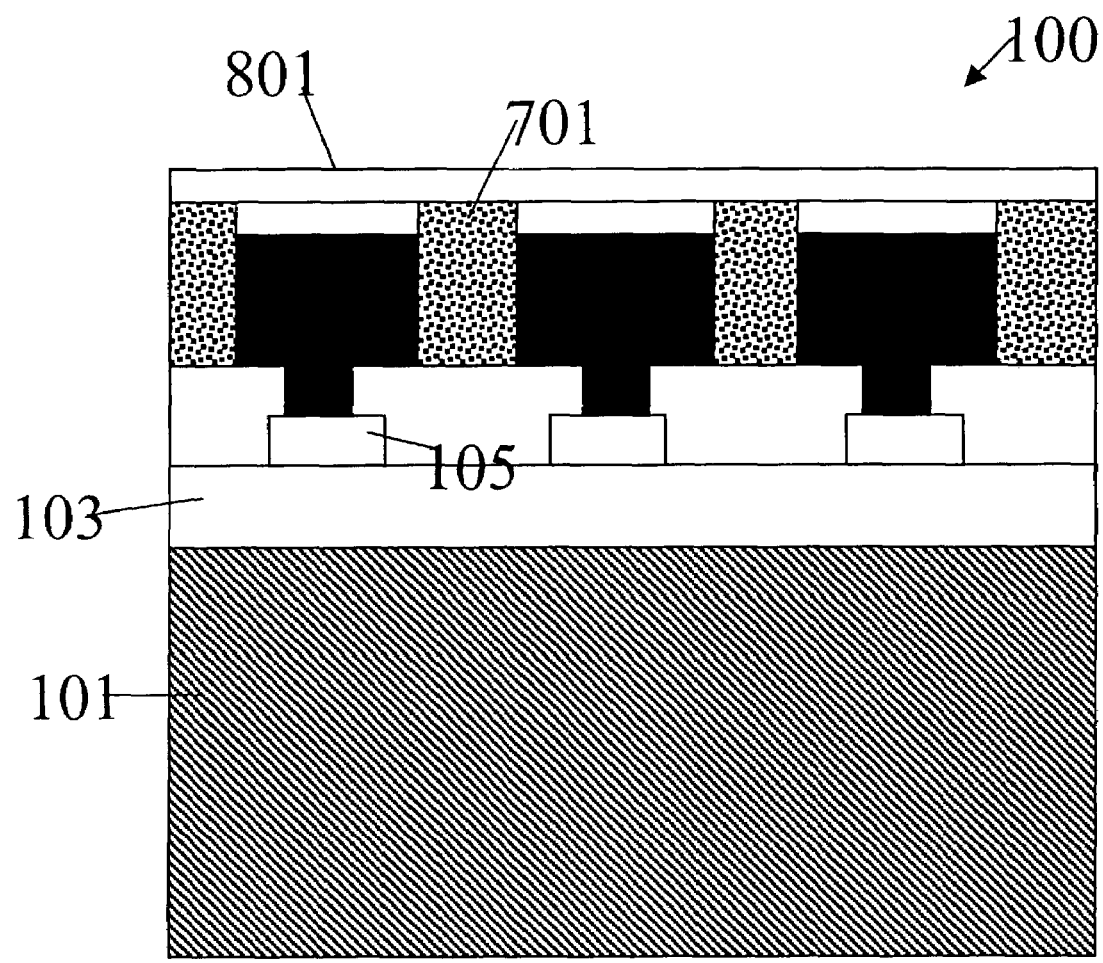

The method forms a capping layer 801 overlying the surface of the porous fill material, as shown in FIG. 8. The capping layer is often a dielectric material, which is denser and resists moisture. As merely an example, the capping layer can include PECVD oxide layers, CVD oxide layers, nitride layers, including PECVD nitride layers, any combination of these, and the like. The capping layer prevents moisture from entering into the porous dielectric material during later processing steps. The method continues and performs other steps, as desired.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for manufacturing integrated circuit devices including metal interconnect structures, the method comprising:
    forming a dielectric material overlying a surface of a semiconductor substrate;
    forming a metal damascene structure in the dielectric material, the dielectric material surrounding the metal damascene structure;
    selectively removing the dielectric material surrounding a portion of the metal damascene structure to expose the portion of the metal damascene structure;
    forming a porous dielectric material surrounding a vicinity of the exposed portion of the metal damascene structure, whereupon the porous dielectric material has a dielectric constant ranging from no greater than 2.6 but greater than 1, forming a cap layer overlying a surface of the metal damascene structure, the cap layer being capable of protecting the metal damascene structure during removal of the dielectric material.

2. A method for manufacturing integrated circuit devices including metal interconnect structures, the method comprising:
    forming a dielectric material overlying a surface of a semiconductor substrate;
    forming a metal damascene structure in the dielectric material, the dielectric material surrounding the metal damascene structure;
    selectively removing the dielectric material surrounding a portion of the metal damascene structure to expose the portion of the metal damascene structure;
    forming a porous dielectric material surrounding a vicinity of the exposed portion of the metal damascene structure, whereupon the porous dielectric material has a dielectric constant ranging from no greater than 2.6 but greater than 1, wherein the porous dielectric material base is a material comprising a plurality of microbubbles.

3. A method for manufacturing integrated circuit devices including metal interconnect structures, the method comprising:
    forming a dielectric material overlying a surface of a semiconductor substrate;
    forming a metal damascene structure in the dielectric material, the dielectric material surrounding the metal damascene structure;
    selectively removing the dielectric material surrounding a portion of the metal damascene structure to expose the portion of the metal damascene structure;
    forming a porous dielectric material surrounding a vicinity of the exposed portion of the metal damascene structure, whereupon the porous dielectric material has a dielectric constant ranging from no greater than 2.6 but greater than 1, wherein the forming of the porous dielectric material comprises adding a plurality of microbubbles within the porous dielectric material to cause the porous dielectric material to be porous.

4. The method of claim 3, wherein the microbubbles have a size of about a nanometer to tens of nanometers.

5. The method of claim 3, further comprising capping the porous dielectric material to substantially prevent a possibility of moisture to enter into one or more of the microbubbles.

6. The method of claim 5, wherein the capping is provided with a PECVD oxide.

7. The method of claim 5, wherein the capping is provided with a nitrogen-bearing material.

8. The method of claim 1, wherein the metal damascene structure is a copper-bearing material.

9. A method for manufacturing integrated circuit devices including metal interconnect structures, the method comprising:

forming a dielectric material overlying a surface of a semiconductor substrate;

forming a metal damascene structure in the dielectric material, the dielectric material surrounding the metal damascene structure;

selectively removing the dielectric material surrounding a portion of the metal damascene structure to expose the portion of the metal damascene structure;

forming a porous dielectric material surrounding a vicinity of the exposed portion of the metal damascene structure, whereupon the porous dielectric material has a dielectric constant ranging from no greater than 2.6 but greater than 1, further comprising recessing portions of the metal damascene structure and depositing a capping layer overlying the recessed portions of the metal damascene structure.

10. A method for manufacturing integrated circuit devices including metal interconnect structures, the method comprising:

forming a dielectric layer overlying a surface of a semiconductor substrate;

forming a conductive interconnect layer overlying the dielectric layer;

forming an interdielectric layer overlying the conductive interconnect layer;

forming a metal damascene structure in the interdielectric layer, the interdielectric layer surrounding the metal damascene structure to enclose a portion of the metal damascene structure;

planarizing the metal damascene structure to a vicinity of an upper surface of the interlayer dielectric layer;

forming a capping layer overlying the planarized metal damascene structure to protect the metal damascene structure;

selectively removing a portion of the dielectric layer surrounding a portion of the metal damascene structure to expose the portion of the metal damascene structure;

forming a porous dielectric material surrounding a vicinity of the exposed portion of the metal damascene structure, whereupon the porous dielectric material has a dielectric constant value ranging from no greater than 2.6 but greater than 1 based upon at least a presence of a plurality of microbubbles within the porous dielectric material; and forming a capping dielectric layer overlying an exposed surface of the porous dielectric material to prevent a possibility of moisture from entering into one or more microbubbles structures within the porous dielectric material.

11. The method of claim 10, wherein the interlayer dielectric material comprises one or more layers.

12. The method of claim 10, wherein the capping dielectric layer is a moisture-resistant material.

13. The method of claim 10, wherein the damascene structure is a dual damascene structure comprising a copper-bearing material.

* * * * *